United States Patent
Hsu et al.

(10) Patent No.: US 11,099,378 B2
(45) Date of Patent: Aug. 24, 2021

(54) WAVELENGTH CONVERSION MODULE AND PROJECTION DEVICE

(71) Applicant: Coretronic Corporation, Hsin-Chu (TW)

(72) Inventors: Pi-Tsung Hsu, Hsin-Chu (TW); Chi-Tang Hsieh, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 0 days.

(21) Appl. No.: 16/851,074

(22) Filed: Apr. 16, 2020

(65) Prior Publication Data
US 2020/0333583 A1    Oct. 22, 2020

(30) Foreign Application Priority Data
Apr. 19, 2019 (CN) .......................... 201910317653.5

(51) Int. Cl.
| | |
|---|---|
| *H04N 9/31* | (2006.01) |
| *G02B 26/00* | (2006.01) |
| *G03B 21/20* | (2006.01) |
| *C09K 11/02* | (2006.01) |
| *H01L 33/50* | (2010.01) |

(52) U.S. Cl.
CPC ............ *G02B 26/008* (2013.01); *C09K 11/02* (2013.01); *G03B 21/2033* (2013.01); *H04N 9/3114* (2013.01); *H01L 33/505* (2013.01)

(58) Field of Classification Search
CPC .... G03B 21/006; G03B 21/008; G03B 21/28; G03B 21/145; G03B 21/204; G03B 21/208; G03B 21/2013; G03B 21/2033; H04N 9/3105; H04N 9/3114; H04N 9/3182; G02B 26/08; G02B 26/008; G02B 26/0833; G02B 26/103; C09K 11/02; C09K 11/774;
(Continued)

(56) References Cited

U.S. PATENT DOCUMENTS

| | | | |
|---|---|---|---|
| 2016/0146433 A1 | 5/2016 | Bukesov et al. | |
| 2017/0233647 A1* | 8/2017 | Sakawa | C03C 4/12 257/98 |

(Continued)

FOREIGN PATENT DOCUMENTS

| | | |
|---|---|---|
| CN | 103794704 | 5/2014 |
| CN | 105393371 | 3/2016 |

(Continued)

OTHER PUBLICATIONS

"Office Action of China Counterpart Application", dated Jun. 3, 2021, p. 1-p. 9.

*Primary Examiner* — Sultan Chowdhury
(74) *Attorney, Agent, or Firm* — JCIPRNET (57) ABSTRACT

A wavelength conversion module and a projection device are provided. The wavelength conversion module includes a substrate, a wavelength conversion layer and a thermal conductive adhesive layer. The wavelength conversion layer is located on the substrate. The thermal conductive adhesive layer is located between the wavelength conversion layer and the substrate. The thermal conductive adhesive layer includes a plurality of particles, the particles are distributed in the thermal conductive adhesive layer, and a particle concentration of the particles has a volume ratio greater than 0% and less than or equal to 80%.

18 Claims, 7 Drawing Sheets

(58) Field of Classification Search
CPC .............. C09K 11/883; C09K 11/7721; C09K 11/7734; C09K 11/7774
See application file for complete search history.

(56) References Cited

U.S. PATENT DOCUMENTS

2018/0348614 A1* 12/2018 Zhang ..................... B32B 7/12
2018/0356716 A1* 12/2018 Hashizume ........... H01L 33/502
2019/0250489 A1* 8/2019 Ikeda ................ G03B 21/2013

FOREIGN PATENT DOCUMENTS

| CN | 109087985 | 12/2018 |
|---|---|---|
| JP | 2016127145 | 7/2016 |

* cited by examiner

WAVELENGTH CONVERSION MODULE AND PROJECTION DEVICE

CROSS-REFERENCE TO RELATED APPLICATION

This application claims the priority benefit of China application serial no. 201910317653.5, filed on Apr. 19, 2019. The entirety of the above-mentioned patent application is hereby incorporated by reference herein and made a part of this specification.

BACKGROUND

Technical Field

The invention relates to an optical module and an optical device containing the optical module, and particularly relates to a wavelength conversion module and a projection device.

Description of Related Art

Recently, projection devices based on solid-state light sources such as light-emitting diodes (LED) and laser diodes (LD) have gradually taken a place in the market. Since the laser diodes have a luminous efficiency of more than 20%, in order to break through light source limitation of LEDs, a pure color light source required by the projection device is gradually developed by using laser source to excite phosphor powder. Generally, in an excising projection device, a phosphor wheel adopting phosphor sheet sintered by Phosphor in Glass (PIG) or Phosphor in Ceramic (PIC) needs to use a pure silica gel or transparent adhesive as a bonding layer to attach the phosphor sheet to a substrate or a reflective layer of the substrate.

However, since the bonding layer formed by the pure silica gel or transparent adhesive has problems of unstable control of coating thickness and uneven coating, and has relatively high thermal conductivity, heat generated by the phosphor sheet excited by an excitation beam at a place where the adhesive thickness is relatively thicker cannot be smoothly conducted to the substrate, so that the heat may be easily accumulated at a local area where the adhesive thickness is thicker. Therefore, it may result in poor excitation efficiency of the phosphor sheet and even cause burnout or deterioration of the phosphor sheet, which may affect the luminous efficiency and reliability of the phosphor wheel.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to a wavelength conversion module, which has good conversion efficiency and reliability.

The invention provides a projection device, which has good optical quality and reliability.

Other objects and advantages of the invention may be further illustrated by the technical features broadly embodied and described as follows.

In order to achieve one or a portion of or all of the objects or other objects, an embodiment of the invention provides a wavelength conversion module. The wavelength conversion module includes a substrate, a wavelength conversion layer and a thermal conductive adhesive layer. The wavelength conversion layer is located on the substrate. The thermal conductive adhesive layer is located between the wavelength conversion layer and the substrate. The thermal conductive adhesive layer includes a plurality of particles, the particles are distributed in the thermal conductive adhesive layer, and a particle concentration of the particles has a volume ratio greater than 0% and less than or equal to 80%.

In order to achieve one or a portion of or all of the objects or other objects, an embodiment of the invention provides a projection device. The projection device includes the aforementioned wavelength conversion module, an excitation light source, a light valve and a projection lens. The excitation light source is adapted to emit an excitation beam, where the excitation beam is transmitted to the wavelength conversion module, and is converted into an illumination beam by the wavelength conversion module. The light valve is located on a transmission path of the illumination beam, and is adapted to convert the illumination beam into an image beam. The projection lens is located on a transmission path of the image beam, and is adapted to project the image beam.

Based on the above description, the embodiments of the invention have at least one of following advantages or effects. In the embodiments of the invention, the wavelength conversion module has higher thermal conductivity and a relatively uniform thickness configuration by adding particles to the thermal conductive adhesive layer, so that a difference in adhesive thickness of the wavelength conversion module is greatly reduced to avoid accumulation of heat generated by the excitation beam incident to the wavelength conversion layer on a local area of the thermal conductive adhesive layer and achieve an effect of improving heating uniformity of the wavelength conversion layer, so that the heat may be evenly and smoothly conducted to the substrate, and an overall heat dissipation efficiency of the wavelength conversion module is improved to maintain good excitation efficiency of the wavelength conversion layer. In this way, the wavelength conversion layer of the wavelength conversion module may maintain good thermal uniformity, and avoid a risk of deterioration or burnout due to a poor heat resistance of the bonding material of the thermal conductive adhesive layer, thereby achieving both good optical quality and reliability. Moreover, since the projection device adopts the wavelength conversion module achieving both good optical quality and reliability, the projection device may also have good optical quality and reliability.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
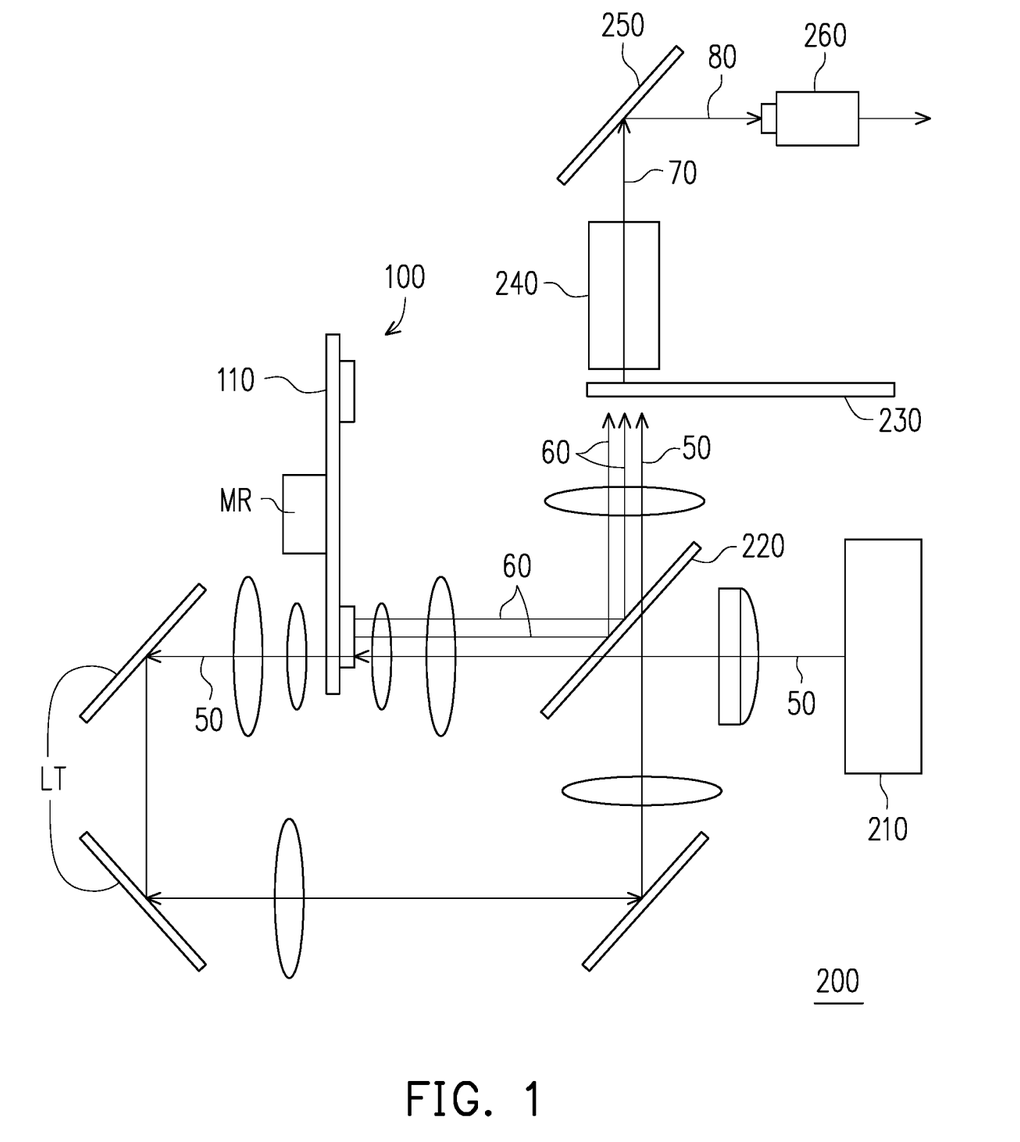
FIG. 1 is a structural schematic diagram of a projection device according to an embodiment of the invention.
Figure 2A:
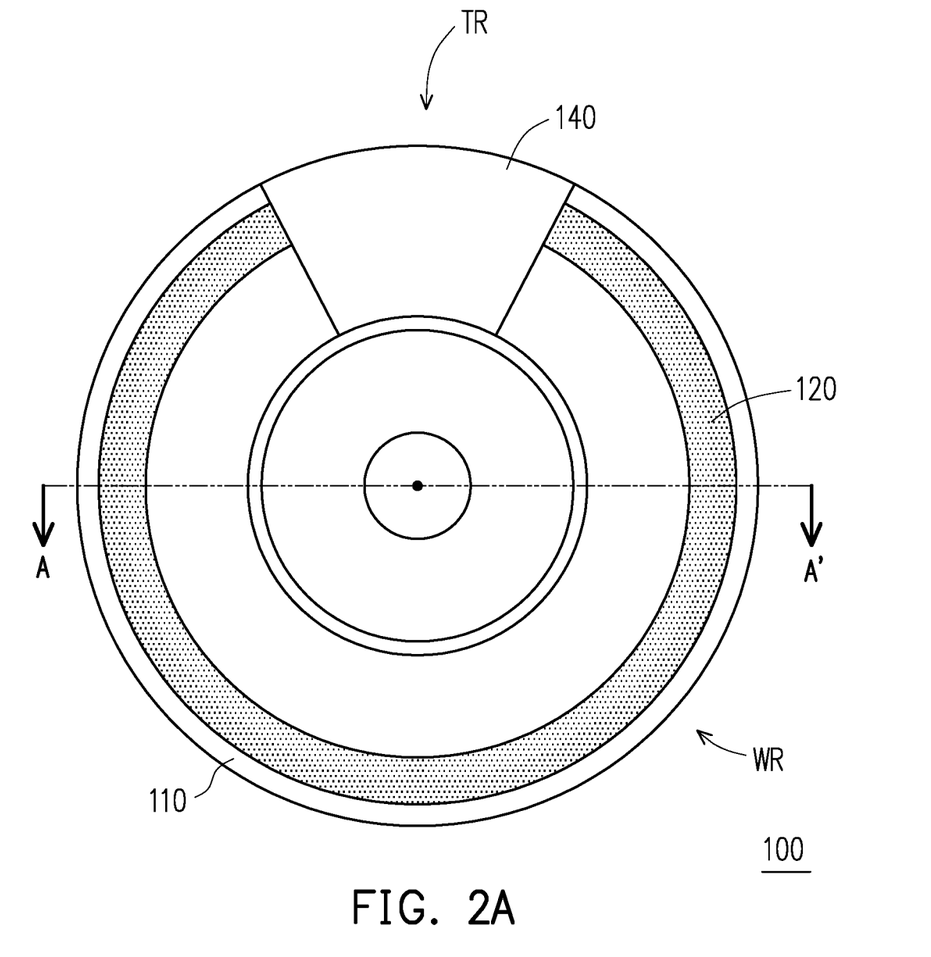
FIG. 2A is a top view of a wavelength conversion module of FIG. 1.
Figure 2B:
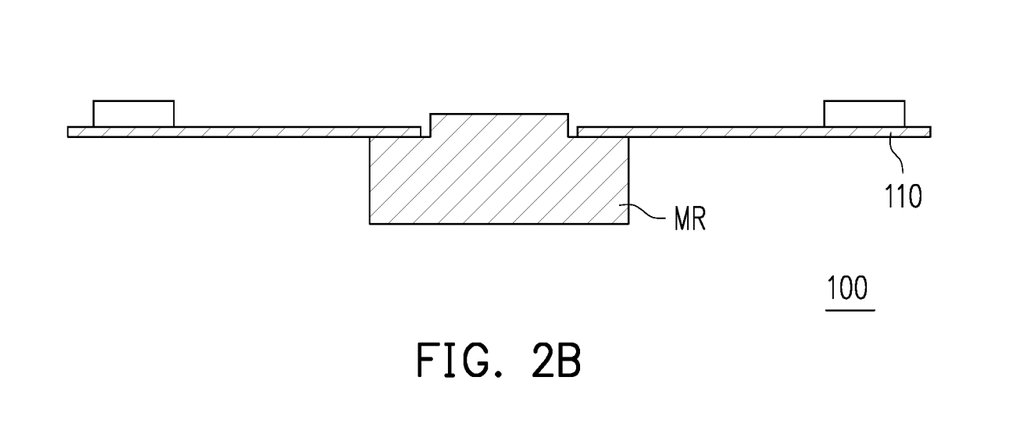
FIG. 2B is a cross-sectional view of the wavelength conversion module of FIG. 2A along a section line A-A'.
Figure 2C:
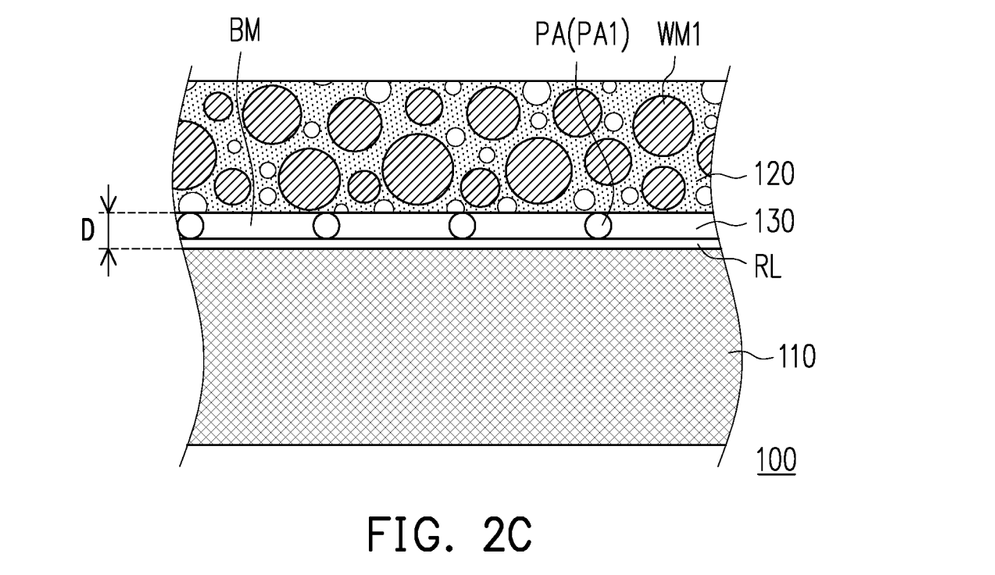
FIG. 2C to FIG. 2F are cross-sectional views of the wavelength conversion module with different thermal conductive adhesive layers in FIG. 2A.

FIG. 1 is a structural schematic diagram of a projection device according to an embodiment of the invention. FIG. 2A is a top view of a wavelength conversion module of FIG. 1. FIG. 2B is a cross-sectional view of the wavelength conversion module of FIG. 2A along a section line A-A'. FIG. 2C to FIG. 2F are cross-sectional views of the wavelength conversion module with different thermal conductive adhesive layers in FIG. 2A. Referring to FIG. 1 to FIG. 2C, the projection device 200 includes an excitation light source 210, a light splitting unit 220, a wavelength conversion module 100, a light valve 250 and a projection lens 260. For example, in the embodiment, the light valve 250 is, for example, a Digital Micro-mirror Device (DMD) or a Liquid-Crystal-On-Silicon (LCOS) panel. However, in other embodiments, the light valve 250 may also be a transmissive liquid crystal panel or other light beam modulator.

For example, as shown in FIG. 1, in the embodiment, the excitation light source 210 is adapted emit an excitation beam 50. In the embodiment, the excitation light source 210 is a laser light source, and the excitation beam 50 is a blue laser beam. For example, the excitation light source 210 may include a plurality of blue laser diodes (not shown) arranged in an array, but the invention is not limited thereto. For example, the laser light source 210 may include blue light-emitting components and invisible light light-emitting components, and the invisible light light-emitting components may include ultraviolet light-emitting diode.

To be specific, as shown in FIG. 1, in the embodiment, the light splitting unit 220 is disposed on a transmission path of the excitation beam 50, and is located between the excitation light source 210 and the wavelength conversion module 100. To be specific, the light splitting unit 220 may be a transflective component, a dichroic component, a polarization splitting component or any other component capable of splitting a light beam. For example, in the embodiment, the light splitting unit 220, for example, allows the blue beam to pass through, but provides a reflection function to light beams of other colors (for example, red, green, yellow, etc.). Namely, the light splitting unit 220 allows the excitation beam 50 of the blue color to pass through, such that the excitation beam 50 may penetrates through the light splitting unit 220 to enter the wavelength conversion module 100.

As shown in FIG. 1, in the embodiment, the wavelength conversion module 100 is located on the transmission path of the excitation beam 50. Moreover, as shown in FIG. 2A to FIG. 2B, in the embodiment, the wavelength conversion module 100 includes at least one wavelength conversion region WR and a light passing region TR. In this way, as shown in FIG. 1 to FIG. 2B, the at least one wavelength conversion region WR of the wavelength conversion module 100 is adapted to convert the excitation beam 50 into at least one wavelength converted beam 60, and the light passing region TR of the wavelength conversion module 100 is adapted to allow the excitation beam 50 to pass through to reach subsequent optical components.

To be specific, as shown in FIG. 2C, in the embodiment, the wavelength conversion module 100 includes a substrate 110, a wavelength conversion layer 120 and a thermal conductive adhesive layer 130. The wavelength conversion layer 120 is located on the substrate 110, and the thermal conductive adhesive layer 130 is located between the wavelength conversion layer 120 and the substrate 110. For example, as shown in FIG. 2A, the wavelength conversion layer 120 is located on the substrate 110, and is disposed corresponding to the at least one wavelength conversion region WR, and includes a wavelength conversion material WM1, where the wavelength conversion material WM1 may convert the excitation beam 50 into the wavelength conversion beam 60.

Moreover, as shown in FIG. 2C, in the embodiment, the wavelength conversion module 100 further includes at least one reflection layer RL. The at least one reflection layer RL is located on the substrate 110, and is located on at least one side of the thermal conductive adhesive layer 130. For example, in the embodiment, the reflection layer RL is located between the thermal conductive adhesive layer 130 and the substrate 110, but the invention is not limited thereto, and in other embodiments, the reflection layer RL may also be located between the thermal conductive adhesive layer 130 and the wavelength conversion layer 120. For example, in the embodiment, the reflection layer RL may be a diffuse reflection layer or a high reflection layer, where the diffuse reflection layer may be a reflection layer mixed with white scattering particles and a bonding material. A material of the white scattering particles may be $TiO_2$, $SiO_2$, $Al_2O_3$, BN, $ZrO_2$, and the bonding material may be silica gel, but the invention is not limited thereto. The high reflection layer may be a metal layer with a protective layer or a dielectric layer coated on the surface of the substrate 110, and a material thereof may be silver or aluminum, but the invention is not limited thereto.

To be specific, as shown in FIG. 2C, the thermal conductive adhesive layer 130 includes a plurality of particles PA and a bonding material BM, the particles PA are distributed in the bonding material BM of the thermal conductive adhesive layer 130, and a particle concentration of the particles PA has a volume ratio greater than 0% and less than or equal to 80%. The volume ratio refers to a volume percentage concentration. On the other hand, for example, in the embodiment, the particles PA include materials of glass, polymer resin and transparent ceramics, etc., which have high transmittance and high thermal conductivity. The bonding material BM may be adhesive materials such as pure silica gel, organic adhesive, inorganic adhesive, organic inorganic adhesive and other bonding materials.

Therefore, in the embodiment, since the particles PA has high transmittance and high thermal conductivity, compared to the known thermal conductive adhesive layer 130 only composed of the bonding material BM, the thermal conductive adhesive layer 130 added with the particles PA may have higher transmittance and thermal conductivity. Moreover, since the thermal conductive adhesive layer 130 is added with the particles PA, when the wavelength conversion layer 120 is attached with the substrate 110, a certain gap is formed between the wavelength conversion layer 120 and the substrate 110 (or the reflection layer RL on the substrate 110) due to existence of the particles PA. As shown in FIG. 2C, a distance D is the gap between the wavelength conversion layer 120 and the substrate 110. In this way, the distance D between the wavelength conversion layer 120 and the substrate 110 may be stably controlled by controlling particle diameters of the particles PA and a proportional relationship there between, so as to stably control a thickness of the thermal conductive adhesive layer 130, and therefore the thermal conductive adhesive layer 130 may be uniformly distributed between the wavelength conversion layer 120 and the substrate 110.

For example, as shown in FIG. 2C, in the embodiment, the particles PA include a plurality of first particles PA1, and the particles PA have an average center particle diameter, and a difference between the particle diameter of the first particles PA1 and the average center particle diameter is less than 20% of the average center particle diameter, and a ratio of an amount of the first particles PA1 and an amount of the particles PA is greater than 80%. Namely, in the embodiment, the particles PA have relatively uniform particle diameters, so as to stably and uniformly separate the wavelength conversion layer 120 and the substrate 110, so that the thermal conductive adhesive layer 130 may be uniformly distributed between the wavelength conversion layer 120 and the substrate 110. For example, in the embodiment, the thermal conductive adhesive layer 130 has an average thickness, and there is a maximum difference between an actual thickness at each place of the thermal conductive adhesive layer 130 and the average thickness of the thermal conductive adhesive layer 130, and a ratio of the maximum difference to the average thickness is not more than 30%. In an embodiment, the ratio of the maximum difference between the actual thickness at each place of the thermal conductive adhesive layer 130 and the average thickness of the thermal conductive adhesive layer 130 may be controlled within 20%. In an embodiment, the particle diameters of the particles PA may be between 5 μm and 50 μm. In an embodiment, a thickness range of the thermal conductive adhesive layer 130 may be between 5 μm and 50 μm.

In this way, since the thermal conductive adhesive layer 130 added with the particles PA may have higher thermal conductivity and relatively uniform thickness, the wavelength conversion module 100 may avoid accumulation of heat generated by the excitation beam incident to the wavelength conversion layer 120 on the local area of the thermal conductive adhesive layer 130, and evenly and smoothly conduct the heat to the substrate 110. In an embodiment, the substrate 110 may be a heat dissipation substrate with high thermal conductivity. In this way, the wavelength conversion layer 120 of the wavelength conversion module 100 may maintain good excitation efficiency, and avoid a risk of deterioration or burnout due to a poor heat resistance of the bonding material of the thermal conductive adhesive layer 130, thereby achieving both good optical quality and reliability.

On the other hand, referring to FIG. 2A to FIG. 2B, in the embodiment, the substrate 110 of the wavelength conversion module 100 has a hollow region (not numbered), which is configured corresponding to the light passing region TR, and the wavelength conversion module 100 further includes a diffuser 140 disposed corresponding to the light passing region TR and the hollow region (not numbered) of the substrate 110. Namely, in the embodiment, the wavelength conversion module 100 is a transmissive wavelength conversion module, and the light passing region TR is adapted to allow the excitation beam 50 to pass through.

In this way, referring back to FIG. 1, FIG. 2A to FIG. 2B, in the embodiment, the wavelength conversion module 100 further includes a first driving device MR, which is adapted to drive the light passing region TR and the at least one wavelength conversion region WR to enter an irradiation range of the excitation beam 50 at different time, so as to selectively allow the excitation beam 50 to pass through or convert the same into at least one wavelength converted beam 60. As shown in FIG. 1, in the embodiment, when the light passing region TR of the wavelength conversion module 100 enters the irradiation range of the excitation beam 50, the excitation beam 50 may pass through the wavelength conversion module 100, and is then transmitted to the filter module 230 through a light transmission module LT. On the other hand, in the embodiment, when the at least one wavelength conversion region WR enters the irradiation range of the excitation beam 50, the excitation beam 50 is converted into the at least one wavelength converted beam 60 by the at least one wavelength conversion region WR. Then, as shown in FIG. 1, the at least one wavelength converted beam 60 transmitting from the wavelength conversion module 100 may be guided to the light splitting unit 220, and is reflected to the subsequent filter module 230 by the light splitting unit 220.

To be specific, as shown in FIG. 1, the projection device 200 further includes the aforementioned filter module 230, and the filter module 230 is located on the transmission path of the excitation light beam 50 and the wavelength converted beam 60, and includes a filter region (not shown) and a transparent region (not shown). The filter module 230 further includes a second driving device (not shown), which is adapted to drive at least one filter region (not shown) to correspondingly enter the irradiation range of the wavelength converted beam 60 at different time, so as to filter the wavelength converted beam 60 by the filter module 230 to present different colors, for example, the wavelength converted beam 60 with a yellow color may respectively form red color light and green color light at different time after passing through the filter module 230. On the other hand, at a different time, the transparent region (not shown) may also correspondingly enter the irradiation range of the excitation beam 50 transmitted to the filter module 230, so as to allow the excitation beam 50 to pass through, for example, allow the excitation beam 50 of the blue color to pass through. In this way, the excitation beam 50 and the wavelength converted beam 60 are sequentially converted into an illumination beam 70 with a plurality of different colors.

On the other hand, as shown in FIG. 1, in the embodiment, the projection device 200 further includes a light homogenize component 240 located on a transmission path of the illumination beam 70. In the embodiment, the light homogenize component 240 includes an integration rod, but the invention is not limited thereto. To be specific, as shown in FIG. 1, when the illumination beam 70 is transmitted to the light homogenize component 240, the light homogenize component 240 may uniform the illumination beam 70 and transmit the same to the light valve 250.

Then, as shown in FIG. 1, the light valve 250 is located on the transmission path of the illumination beam 70, and is adapted to convert the illumination beam 70 into an image beam 80. The projection lens 260 is located on a transmission path of the image beam 80, and is adapted to project the image beam 80 onto a screen or a wall (not shown) to form an image.

Moreover, since the projection device 200 adopts the wavelength conversion module 100 capable of achieving both good optical quality and reliability, the projection device 200 may also have good optical quality and reliability.

Moreover, it should be noted that a matching relationship of the proportion relationship of the first particles PA1 and the particles PA, the particle concentration and the particle material of the thermal conductive adhesive layer 130 of the wavelength conversion module 100 of the invention is not limited to the embodiment of FIG. 2C, and related factors thereof may be modified by any technician of the art with reference of the invention to achieve effects and advantages similar with that of the aforementioned wavelength conversion module 100, which is still considered to be within the scope of the invention. The embodiments of FIG. 2D to FIG. 2F are provided below for further description.

Figure 2D:
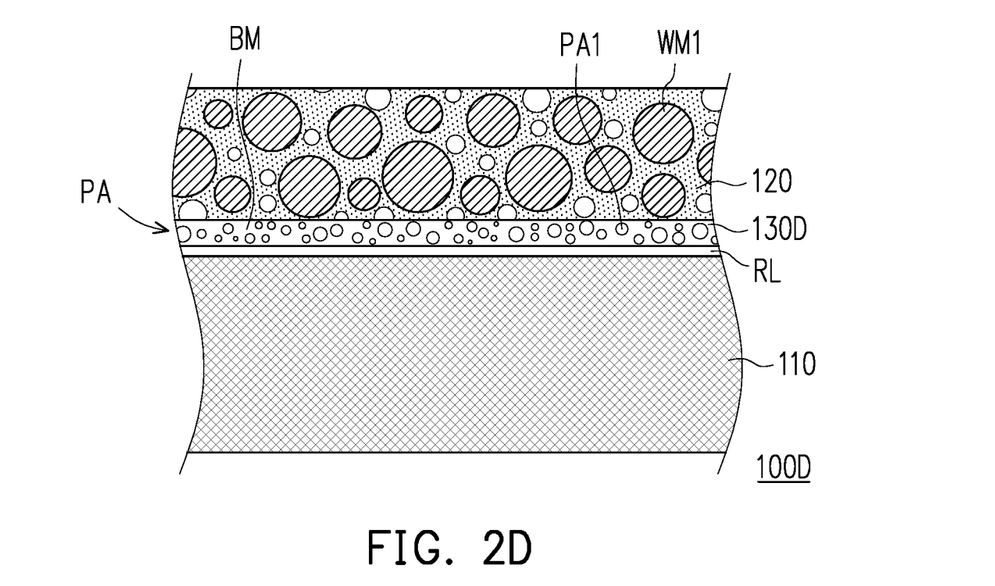

In another embodiment, the thermal conductive adhesive layer 130D of the wavelength conversion module 100D of FIG. 2D is similar to the thermal conductive adhesive layer 130 of the wavelength conversion module 100 of FIG. 2C, and differences there between are as follows. Referring to FIG. 2D, the particles PA include a plurality of first particles PA1, a ratio of a difference between the particle diameter of the first particles PA1 and the average center particle diameter of the particles PA is less than 20% of the average center particle diameter, and a ratio of an amount of the first particles PA1 and an amount of the particles PA is greater than 50%. Namely, in the embodiment, the particles PA have relatively non-uniform particle diameters, so that when the wavelength conversion layer 120 and the substrate 110 are attached, the applied pressure to each place is controlled to be even and a positioning jig is used, so that there is a certain gap formed between the wavelength conversion layer 120 and the substrate 110 (or the reflection layer RL on the substrate 110) due to existence of the particles PA. In this way, the thickness of the thermal conductive adhesive layer 130D may still be stably controlled, and the thermal conductive adhesive layer 130D may be evenly distributed between the wavelength conversion layer 120 and the substrate 110. Moreover, in the embodiment, since the particle diameters of the particles PA are relatively not uniform, the particles PA with smaller particle diameters may be filled in fissures between the particles PA with larger particle diameters, so as to further improve the overall thermal conductivity and thermal conduction efficiency.

In this way, since the thermal conductive adhesive layer 130D added with the particles PA may also have higher thermal conductivity and relatively even thickness, the wavelength conversion module 100D may also achieve the same functions with that of the wavelength conversion module 100. Moreover, when the wavelength conversion module 100D is applied to the projection device 200, the projection device 200 may also achieve the aforementioned effects and advantages, which is not repeated.

Figure 2E:
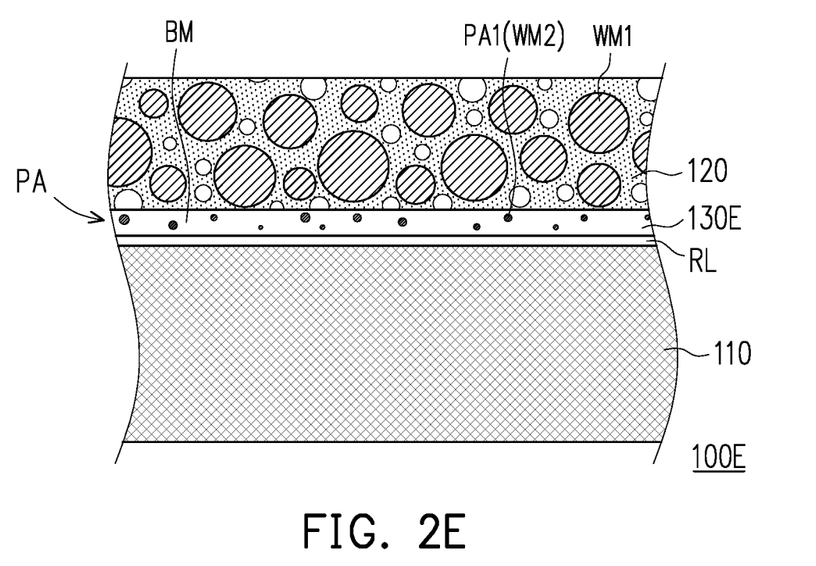
Figure 2F:
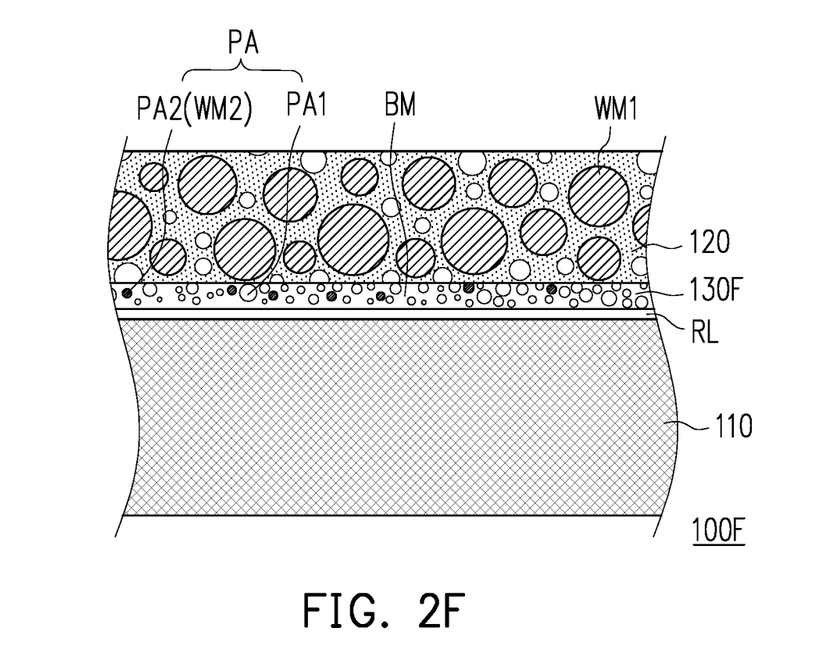

In another embodiment, the thermal conductive adhesive layer 130E of the wavelength conversion module 100E of FIG. 2E is similar to the thermal conductive adhesive layer 130 of the wavelength conversion module 100 of FIG. 2C, and differences there between are as follows. Referring to FIG. 2E, in the embodiment, the material of the particles PA is a wavelength conversion material WM2, and the particles PA includes a plurality of first particles PA1. For example, in the embodiment, the wavelength conversion material WM2 of the thermal conductive adhesive layer 130E may be the same or different to the wavelength conversion material WM1 of the wavelength conversion layer 120. To be specific, since the particles PA of the embodiment are made of the wavelength conversion material WM2 rather than a transparent material with high transmittance, a concentration of the particles PA may be determined through relevant tests without affecting the reflection efficiency of the substrate 110 and the reflection layer RL, so that the light incident to the thermal conductive adhesive layer 130E does not affect color uniformity of the subsequent illumination beam due to existence of the wavelength conversion material WM2. For example, in the embodiment, the particle concentration of the particles PA has a volume ratio greater than 0% and smaller than or equal to 10%. In this way, a certain degree of overall thermal conductivity and thermal conduction efficiency are improved.

Therefore, in the embodiment, by controlling the particle diameters of the particles PA within a certain diameter range, a certain gap is still formed between the wavelength conversion layer 120 and the substrate 110 (or the reflection layer RL on the substrate 110) due to existence of the particles PA. In this way, the thickness of the thermal conductive adhesive layer 130E may still be stably controlled, so that the thermal conductive adhesive layer 130E may be evenly distributed between the wavelength conversion layer 120 and the substrate 110.

In this way, since the thermal conductive adhesive layer 130E added with the particles PA may also have higher thermal conductivity and relatively even thickness, the wavelength conversion module 100E may also achieve the same functions with that of the wavelength conversion module 100. Moreover, when the wavelength conversion module 100E is applied to the projection device 200, the projection device 200 may also achieve the aforementioned effects and advantages, which is not repeated.

In another embodiment, the thermal conductive adhesive layer 130F of the wavelength conversion module 100F of FIG. 2F is similar to the thermal conductive adhesive layer 130D of the wavelength conversion module 100D of FIG. 2D and the thermal conductive adhesive layer 130E of the wavelength conversion module 100E of FIG. 2E, and differences there between are as follows. Referring to FIG. 2F, in the embodiment, the particles PA include a plurality of first particles PA1 and a plurality of second particles PA2, a material of the first particles PA1 includes glass, polymer resin, transparent ceramics, etc., and a material of the second particles PA2 may be the wavelength conversion material WM2. In other words, in the embodiment, the particles PA include particles of at least two different materials. Moreover, similar to the embodiment of FIG. 2E, the reflection efficiency of the substrate 110 and the reflection layer RL is ensured by adjusting a number/concentration ratio relationship of the first particles PA1 or the second particles PA2 in the thermal conductive adhesive layer 130F of the wavelength conversion module 100F. For example, in the embodiment, a particle concentration of the second particles PA2 has a volume ratio greater than 0% and less than or equal to 10%.

In this way, in the embodiment, since the thermal conductive adhesive layer 130F, the thermal conductive adhesive layer 130D of FIG. 2D and the thermal conductive adhesive layer 130E of FIG. 2E have similar structure, and the thermal conductive adhesive layer 130F added with the particles PA may also have higher thermal conductivity and relatively even thickness, the wavelength conversion module 100F may also achieve the same functions with that of the wavelength conversion module 100. Moreover, when the wavelength conversion module 100F is applied to the projection device 200, the projection device 200 may also achieve the aforementioned effects and advantages, which is not repeated.

On the other hand, in the embodiment of FIG. 2C to FIG. 2F, although the wavelength conversion module 100 including one reflection layer RL is taken as an example for description, the invention is not limited thereto. In other embodiments, the wavelength conversion module 100 may also include more than one layer of the reflective layer, which is further described below with reference of the embodiment of FIG. 3.

Figure 3:
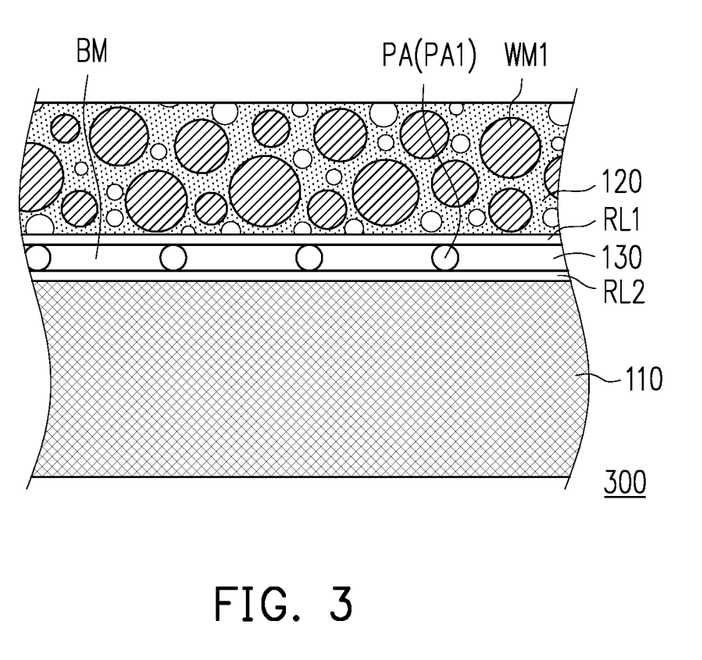
FIG. 3 is a cross-sectional view of another wavelength conversion module of FIG. 1.

FIG. 3 is a cross-sectional view of another wavelength conversion module of FIG. 1. Referring to FIG. 3, in the embodiment, the wavelength conversion module 300 is similar to the wavelength conversion module 100 of FIG. 2C, and differences there between are as follows. As shown in FIG. 3, in the embodiment, the wavelength conversion module 100 includes two reflection layers RL1 and RL2, and the two reflection layers RL1 and RL2 are respectively located on two sides of the thermal conductive adhesive layer 130. For example, in the embodiment, the two reflection layers RL1 and RL2 may be respectively a diffuse reflection layer or a high reflection layer. In this way, by increasing the number of the reflection layers, the reflection efficiency of the wavelength conversion module 300 is ensured.

In this way, in the embodiment, since the wavelength conversion module 300 and the wavelength conversion module 100 of FIG. 2C have the same configuration structure of the thermal conductive adhesive layer 130, the wavelength conversion module 300 may also achieve the same functions with that of the wavelength conversion module 100. Moreover, when the wavelength conversion module 300 is applied to the projection device 200, the projection device 200 may also achieve the aforementioned effects and advantages, which is not repeated.

The wavelength conversion modules 100D, 100E, 100F of FIG. 2D to FIG. 2F may also be configured with two reflection layers RL, so as to form the similar structure with that of the wavelength conversion module 300. Moreover, similarly, when the structures similar to the wavelength conversion module 300 are applied to the projection device 200, the projection device 200 may also achieve the aforementioned effects and advantages, which is not repeated.

On the other hand, in the embodiment of FIG. 1, although the projection device 200 including the transmissive wavelength conversion module 100 is taken as an example for description, the invention is not limited thereto. In other embodiments, the projection device 200 may also adopt a reflective wavelength conversion module, and an optical path the projection device 200 may be properly modified by any ordinary technician skilled in the art to achieve the similar effects and advantages with that of the aforementioned projection device, which is still considered to be within the scope of the invention. Some other embodiments are provided below for further description.

Figure 4A:
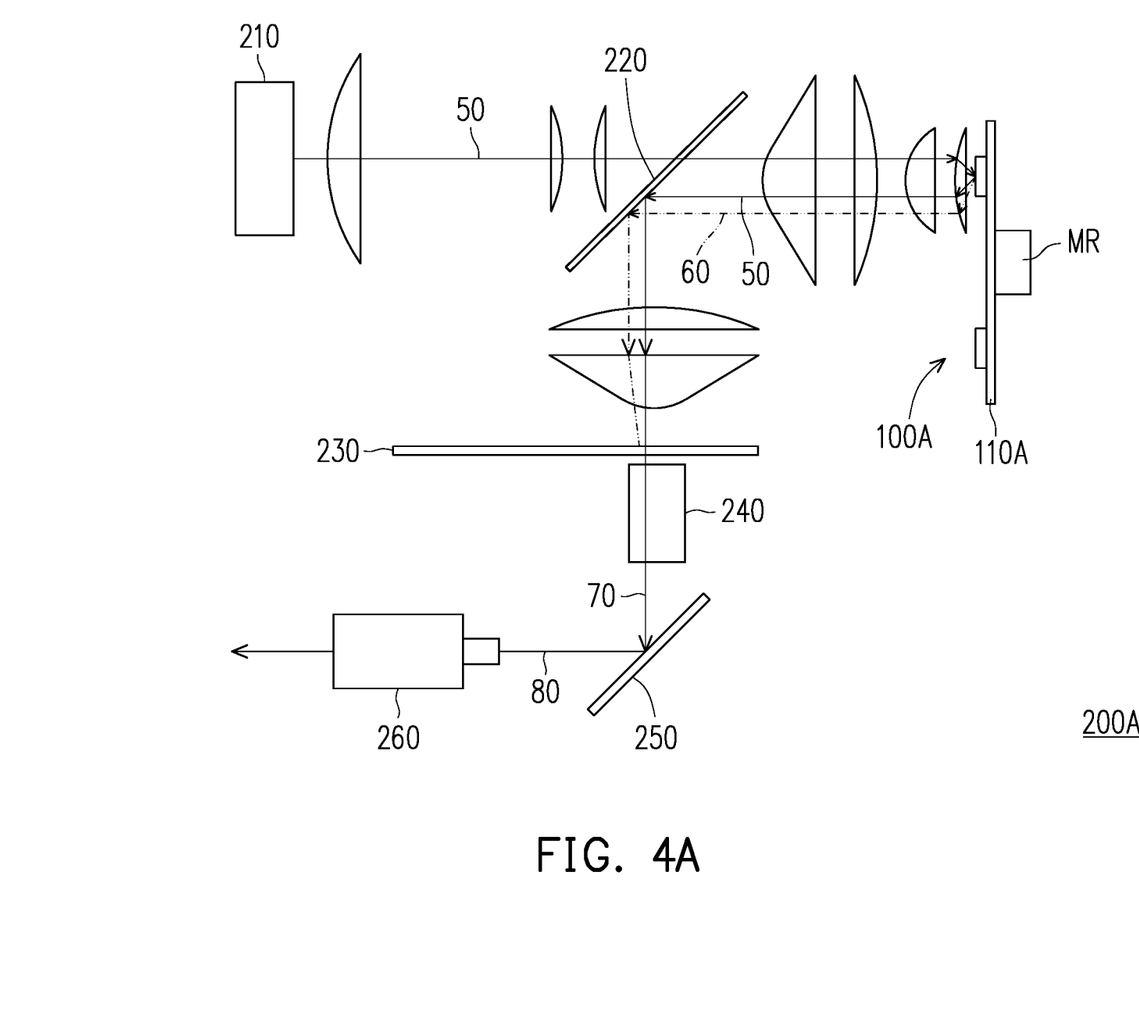
FIG. 4A is a structural schematic diagram of another projection device according to another embodiment of the invention.
Figure 4B:
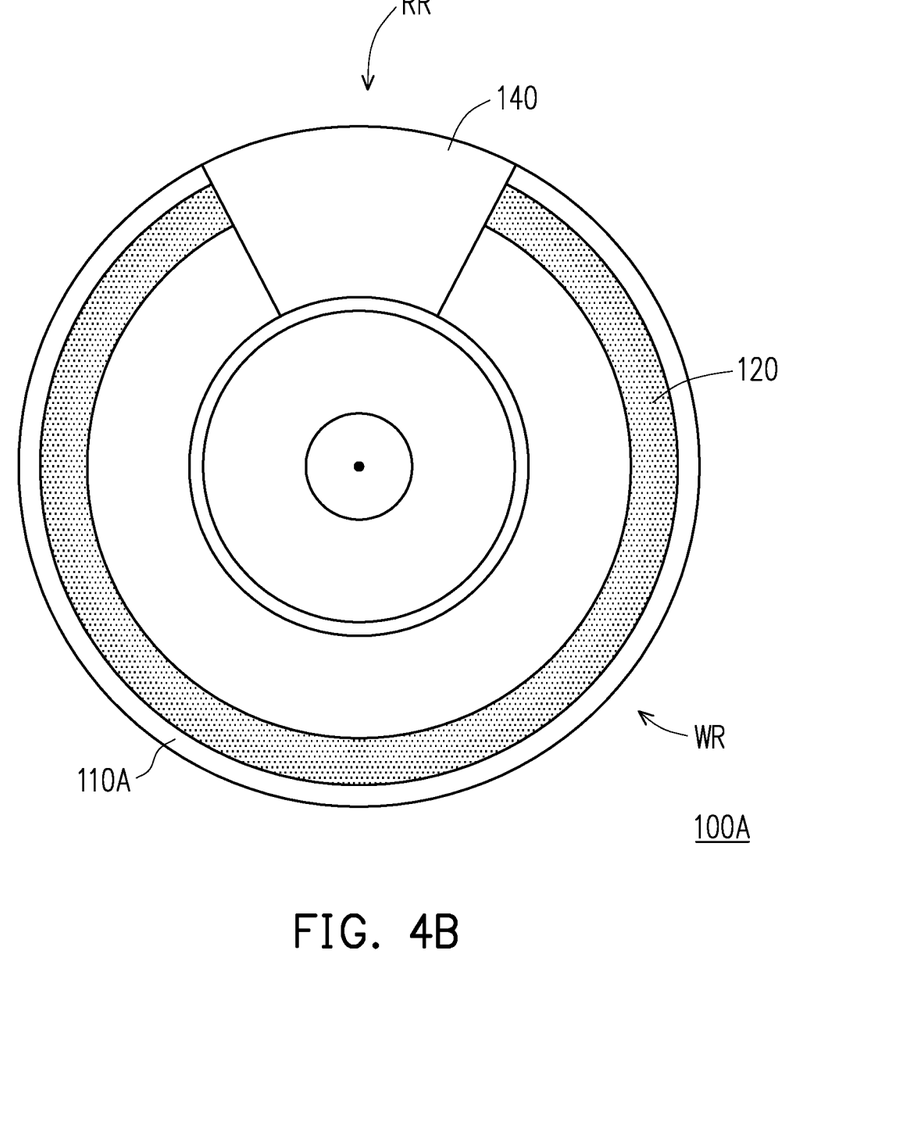
FIG. 4B is a top view of a wavelength conversion module of FIG. 4A.

FIG. 4A is a structural schematic diagram of another projection device according to another embodiment of the invention. FIG. 4B is a top view of a wavelength conversion module of FIG. 4A. As shown in FIG. 4A and FIG. 4B, in the embodiment, the projection device 200A adopts a wavelength conversion module 100A, and the wavelength conversion module 100A is similar to the wavelength conversion module 100, and a difference there between is only that the wavelength conversion module 100A is a reflective wavelength conversion module, so that the substrate 110A of the wavelength conversion module 100A does not have the hollow region, but is a substrate with an integral round surface. In other words, the wavelength conversion module 100A does not have the light passing region TR of the wavelength conversion module 100, but a reflection region RR is configured at the position corresponding to the light passing region TR of the wavelength conversion module 100 to reflect the excitation beam 50.

To be specific, as shown in FIG. 4A and FIG. 4B, in the embodiment, when the reflection region RR of the wavelength conversion module 100A enters the irradiation range of the excitation beam 50, the excitation beam 50 may be reflected by the reflection region RR of the wavelength conversion module 100A, and then the excitation beam 50 transmitting from the wavelength conversion module 100A is guided to the light splitting unit 220, and is reflected to the subsequent filter module 230. On the other hand, in the embodiment, when the at least one wavelength conversion region WR enters the irradiation range of the excitation beam 50, the excitation beam 50 is converted into at least one wavelength converted beam 60 by the at least one wavelength conversion region WR. Then, as shown in FIG. 4A, the at least one wavelength converted beam 60 transmitting from the wavelength conversion module 100A may be guided to the light splitting unit 220, and is reflected to the subsequent filter module 230. Then, a filter region (not shown) of the filter module 230 may correspondingly enter the irradiation range of the wavelength converted beam 60 at a different time to respectively produce red light and green light. On the other hand, a transparent region (not shown) of the filter module 230 may also correspondingly enter an irradiation range of the excitation beam 50 transmitted to the filter module 230 at a different time to produce blue light, so as to form the subsequent illumination beam 70 and the image beam 80.

In this way, the wavelength conversion module 100A adopted by the projection device 200A and the wavelength conversion module 100 of FIG. 2C have the similar configuration structure of the thermal conductive adhesive layer 130, so that the same functions are achieved, and the projection device 200 may achieve effects and advantages similar with that of the aforementioned projection device 300, which is not repeated.

Moreover, the substrate 110A of the wavelength conversion module 100A may also be used in the aforementioned wavelength conversion modules 100D, 100E, 100F to form structures similar with that of the wavelength conversion module 100A. Moreover, similarly, when the structures similar to the wavelength conversion module 100A are applied to the projection device 200, the projection device 200 may also achieve effects and advantages similar with that of the projection device 200, which is not repeated.

In summary, the embodiments of the invention have at least one of following advantages or effects. In the embodiments of the invention, the wavelength conversion module has higher thermal conductivity and a relatively uniform thickness configuration by adding particles to the thermal conductive adhesive layer, so that a difference in adhesive thickness of the wavelength conversion module is greatly reduced to avoid accumulation of heat generated by the excitation beam incident to the wavelength conversion layer on a local area of the thermal conductive adhesive layer and achieve an effect of improving heating uniformity of the wavelength conversion layer, so that the heat may be evenly and smoothly conducted to the substrate, and an overall heat dissipation efficiency of the wavelength conversion module is improved to maintain good excitation efficiency of the wavelength conversion layer. In this way, the wavelength conversion layer of the wavelength conversion module may maintain good thermal uniformity, and avoid a risk of deterioration or burnout due to a poor heat resistance of the bonding material of the thermal conductive adhesive layer, thereby achieving both good optical quality and reliability. Moreover, since the projection device adopts the wavelength conversion module achieving both good optical quality and reliability, the projection device may also have good optical quality and reliability.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion module, comprising:
a substrate;
a wavelength conversion layer, located on the substrate; and
a thermal conductive adhesive layer, located between the wavelength conversion layer and the substrate, wherein the thermal conductive adhesive layer comprises a plurality of particles, the particles are distributed in the thermal conductive adhesive layer, and a particle concentration of the particles has a volume ratio greater than 0% and less than or equal to 80%, wherein the thermal conductive adhesive layer has an average thickness, there is a maximum difference between an actual thickness of the thermal conductive adhesive layer and the average thickness, and a ratio of the maximum difference to the average thickness is not greater than 30%.

2. The wavelength conversion module as claimed in claim 1, wherein the particles have an average center particle diameter, and the particles comprise a plurality of first particles, and a difference between a particle diameter of the first particles and the average center particle diameter is less than 20% of the average center particle diameter, and a ratio of an amount of the first particles and an amount of the particles is greater than 80%.

3. The wavelength conversion module as claimed in claim 1, wherein the particles have an average center particle diameter, and the particles comprise a plurality of first particles, and of a difference between a particle diameter of the first particles and the average center particle diameter is less than 20% of the average center particle diameter, and a ratio of an amount of the first particles and an amount of the particles is greater than 50%.

4. The wavelength conversion module as claimed in claim 1, wherein the particles comprise a material of glass, polymer resin, transparent ceramics, or a wavelength conversion material.

5. The wavelength conversion module as claimed in claim 4, wherein when the material of the particles is the wavelength conversion material, the particle concentration of the particles has the volume ratio greater than 0% and less than or equal to 10%.

6. The wavelength conversion module as claimed in claim 1, wherein the particles comprise a plurality of first particles and a plurality of second particles, the first particles comprise a material of glass, polymer resin, or transparent ceramics, and the second particles comprise a wavelength conversion material.

7. The wavelength conversion module as claimed in claim 6, wherein a particle concentration of the second particles has a volume ratio greater than 0% and less than or equal to 10%.

8. The wavelength conversion module as claimed in claim 1, further comprising:
at least one reflection layer, located on the substrate, and located on at least one side of the thermal conductive adhesive layer.

9. The projection device as claimed in claim 1, wherein the particles have an average center particle diameter, and the particles comprise a plurality of first particles, and of a difference between a particle diameter of the first particles and the average center particle diameter is less than 20% of the average center particle diameter, and a ratio of an amount of the first particles and an amount of the particles is greater than 50%.

10. A wavelength conversion module, comprising:
a substrate;
a wavelength conversion layer, located on the substrate; and
a thermal conductive adhesive layer, located between the wavelength conversion layer and the substrate, wherein the thermal conductive adhesive layer comprises a plurality of particles, the particles are distributed in the thermal conductive adhesive layer, and a particle concentration of the particles has a volume ratio greater than 0% and less than or equal to 80%, wherein a particle diameter of the particles and/or a thickness range of the thermal conductive adhesive layer are/is between 5 µm and 50 µm.

11. A projection device, comprising:
a wavelength conversion module, comprising:
a substrate;
a wavelength conversion layer, located on the substrate; and
a thermal conductive adhesive layer, located between the wavelength conversion layer and the substrate, and comprising a plurality of particles, wherein the particles are distributed in the thermal conductive adhesive layer, and a particle concentration of the particles of the thermal conductive adhesive layer has a volume ratio greater than 0% and less than or equal to 80%;
an excitation light source, adapted to emit an excitation beam, wherein the excitation beam is transmitted to the wavelength conversion module, and is converted into an illumination beam by the wavelength conversion module;
a light valve, located on a transmission path of the illumination beam, and adapted to convert the illumination beam into an image beam; and
a projection lens, located on a transmission path of the image beam, and adapted to project the image beam,
wherein the thermal conductive adhesive layer has an average thickness, there is a maximum difference between an actual thickness of the thermal conductive adhesive layer and the average thickness, and a ratio of the maximum difference to the average thickness is not greater than 30%.

12. The projection device as claimed in claim 11, wherein the particles have an average center particle diameter, and the particles comprise a plurality of first particles, and a difference between a particle diameter of the first particles and the average center particle diameter is less than 20% of the average center particle diameter, and a ratio of an amount of the first particles and an amount of the particles is greater than 80%.

13. The projection device as claimed in claim 11, wherein the particles comprise a material of glass, polymer resin, transparent ceramics, or a wavelength conversion material.

14. The projection device as claimed in claim 13, wherein when the material of the particles is the wavelength conversion material, the particle concentration of the particles has the volume ratio greater than 0% and less than or equal to 10%.

15. The projection device as claimed in claim 11, wherein the particles comprise a plurality of first particles and a plurality of second particles, the first particles comprise a material of glass, polymer resin, or transparent ceramics, and the second particles comprise a wavelength conversion material.

16. The projection device as claimed in claim 15, wherein a particle concentration of the second particles has a volume ratio greater than 0% and less than or equal to 10%.

17. The projection device as claimed in claim 11, wherein a particle diameter of the particles and/or a thickness range of the thermal conductive adhesive layer are/is between 5 µm and 50 µm.

18. The projection device as claimed in claim 11, wherein the wavelength conversion module further comprises at least one reflection layer, located on the substrate, and the at least one reflection layer is located on at least one side of the thermal conductive adhesive layer.

* * * * *